(12) United States Patent
Sands et al.

(10) Patent No.: US 9,769,947 B1
(45) Date of Patent: Sep. 19, 2017

(54) CABLE MANAGEMENT FOR RACK-MOUNTED COMPUTING DEVICES

(71) Applicant: Oracle International Corporation, Redwood City, CA (US)

(72) Inventors: Steven Sands, Austin, TX (US); Leslie Keller, Cedar Park, TX (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 15/075,312

(22) Filed: Mar. 21, 2016

(51) Int. Cl.
H02B 1/20 (2006.01)
H05K 7/14 (2006.01)
H05K 7/18 (2006.01)

(52) U.S. Cl.
CPC ......... *H05K 7/1491* (2013.01); *H05K 7/1489* (2013.01); *H05K 7/18* (2013.01)

(58) Field of Classification Search
CPC ....... H05K 7/1491; H05K 7/1489; H05K 7/18
USPC ................................................. 361/825–826
See application file for complete search history.

(56) References Cited

U.S. PATENT DOCUMENTS

| | | | |
|---|---|---|---|
| 6,392,149 B1 | 5/2002 | Kim et al. | |
| 6,523,918 B1* | 2/2003 | Baiza ................... | H05K 7/1491 211/26 |
| 6,854,605 B2 | 2/2005 | Wrycraft | |
| 7,189,924 B1* | 3/2007 | Popescu ............... | H05K 7/1491 174/69 |
| 8,045,343 B2* | 10/2011 | Fan ...................... | H05K 7/1491 361/810 |
| 8,132,874 B2 | 3/2012 | Ong et al. | |

\* cited by examiner

*Primary Examiner* — Hung S Bui
(74) *Attorney, Agent, or Firm* — Marsh Fischmann & Breyfogle LLP; Jonathon A. Szumny (57) ABSTRACT

A cable management apparatus that limits the degree of travel of a FRU (e.g., server, other computing device, power supply, etc.) out of a storage rack to an amount just necessary to service one or more particular components of the FRU (e.g., fan bay, etc.) free of having to power down the FRU which provides a more cost effective maintenance strategy for users. As a result, the disclosed cable management apparatus advantageously allows for the use of shorter cables between the FRU and other devices (e.g., other FRUs, switches, power supplies, etc.), improved airflow through the FRUs and the storage rack, reduced complexity of the cable management apparatus, simplified installation and manipulation of the apparatus, and the like.

17 Claims, 11 Drawing Sheets

CABLE MANAGEMENT FOR RACK-MOUNTED COMPUTING DEVICES

BACKGROUND

1. Field of the Invention

The present invention generally relates to computing or storage racks (e.g., cabinets, libraries) for holding computing devices or field replaceable units (FRUs) such as servers, tape drives, and the like and, more particularly, to systems and devices for use in managing cables, wires, and the like used in the racks.

2. Relevant Background

Storage racks (e.g., computing racks, server racks, network racks, engineered systems, etc.) are standardized frames that are designed to hold a plurality of computing devices or related components (e.g., rack-mounted servers, power distribution units or backup devices, hard drives, and/or other types of FRUs) in, for instance, a stacked or side by side manner. Generally, rack systems include a mechanical framework made up of a number of vertical support members (e.g., posts, Radio Electronics Television Manufacturers Association ("RETMA") rails) extending upward from a floor or other platform and defining a space therewithin into which FRUs may be inserted. Typically, the vertical support members define a plurality of "bays," where each bay is configured to receive a corresponding FRU. Each bay may have a standardized height in one or more multiples of a rack unit (U) to correspond with correspondingly sized FRUs. For instance, industry standard rack systems often come in heights of 18 U, 22 U, 36 U, 42 U, and the like. Also, a rack system may be in the form of a 19-inch rack (i.e., the width between the front two vertical members may be 19"), a 23-inch rack, or the like.

It is generally desirable for each FRU to be installed and/or serviced without affecting operation of the other FRUs. In many cases, it is desirable for each FRU to be maintained or accessed without disconnecting it from power or communications/network links (e.g., to provide hot swappable and maintainable servers in an enterprise or data center environment). To this end, each FRU may be mounted within a bay of the rack using a rail, slide or rack-mount kit. A rail kit typically includes a pair of outer rail assemblies, each of which is attached to vertical support members of the rack and extends horizontally to define a server mounting location within a bay of the rack. Each outer rail assembly may be mated or otherwise interconnected with a middle rail or middle member of the rail kit. The middle rail often will be supported within an inner channel or groove of the outer rail assembly and the middle rail may be positioned by sliding within the outer rail assembly between retracted and extended positions. In the extended position, the middle rails typically extend outward from the ends of the outer rail assemblies several inches to a foot or more to allow access to an attached or supported server or other computing device. In the retracted position, the middle rail has its outer end positioned within the outer rail.

To mount a FRU in the rack, a pair of inner or rack rails is attached to an outer surface of a server (or other computing device) chassis, and each of the inner or rack rails is coupled with or otherwise interconnected to a corresponding one of the middle members or rails. Generally, a FRU is mounted within the storage rack by extending out the middle rail, aligning the ends of the both of the inner or rack rails on the server chassis with the ends of the middle rails, and, once proper alignment is achieved on both sides, pushing on the FRU chassis to cause the inner rails or racks to mate or couple with the middle members or rails (e.g., in a tongue-and-groove manner) as the inner rails slide within channels or grooves of the middle member or rails. Continued pushing then causes the middle member or rail to slide within the outer rail or member from the extended position to the retracted position, which allows the storage rack door (if provided) to be closed.

A FRU often includes a number of cables (e.g., electrical, optical, etc.) extending from a rear thereof that interconnect the FRU with other FRUs, switches, power supplies, and the like. When the FRU is pulled out of the rack for servicing or the like, it is therefore often necessary to either disconnect one or more of the cables from the FRU (e.g., cold servicing) or provide some form of cable management system that supports a portion of the cables having a length at least about equal to the distance by which the FRU is moved as it is withdrawn from the rack and thus allows the cables to remain interfaced with the FRU (e.g., hot servicing). Existing cable management systems often include one or more cable management arms (CMAs) to which the cables may be attached or otherwise disposed adjacent for maintaining order of the cables (e.g., limiting tangling, etc.) as the FRU is pushed into and pulled out of the rack. Each CMA typically includes one articulating member connected to (or otherwise fixed relative to) the FRU and another articulating member connected to (or otherwise fixed relative to) a rear portion of the rack, where the articulating members pivot or fold relative to each other (e.g., accordion style) to accommodate movement of the FRU on the rail assemblies into and out of the rack.

SUMMARY

Existing CMAs are often complex in design as they need to be built ruggedly and require longer cables for implementation. The increased complexity of existing CMAs increases the costs associated with the design and manufacture thereof while also increasing the likelihood of failure. Furthermore, existing CMAs and the longer cabling associated therewith results in reduced airflow through the FRUs and the rack (even with reduced cable counts). Specifically, the articulating members or arms of existing CMAs fold against each other when a FRU is fully inserted into the rack. The portions of cabling secured to the respective articulating members can thus also fold against each other or otherwise overlap exacerbating the reduction in airflow through the rack. The result of such reduced airflow is a negative effect on proper operating temperatures of the FRUs and therefore a reduction in overall system operational performance.

In view of the foregoing, disclosed herein are utilities (e.g., apparatuses, systems, methods) for managing cabling (e.g., cables, wires, etc.) of FRUs mounted in a storage rack (e.g., computing racks, server racks, network racks, engineered systems, etc.) to allow for hot servicing of the FRUs (e.g., for hot swapping fan modules of a server or the like) with reduced cabling lengths and increased airflow through the rack. The utilities include a cable management apparatus that limits the distance that a FRU can be pulled out of a storage rack (i.e., limits the travel of the FRU in a direction away from the rear portion of the storage rack) to advantageously allow for the use of shorter cables between the FRU and other devices (e.g., other FRUs, switches, power supplies, etc.), improved airflow through the FRUs and the storage rack, reduced complexity of the cable management apparatus, simplified installation and manipulation of the apparatus, and the like. For instance, the cable management apparatus may be configured to allow a FRU (e.g., server) to only be pulled out by an amount necessary to service (e.g., replace) a fan or other module of the server without shutting or powering down the server. After the servicing, the server may simply be pushed the shorter distance back into the storage rack.

In one arrangement, the disclosed cable management apparatus may provide first and second opposite cable routing paths between the FRU and other components or devices, where the cable routing paths may be configured to be in an at least partially or fully non-overlapped or non-folded configuration relative to each other when the FRU is substantially fully inserted into the rack. As an example, the first and second cable routing paths may be at least partially formed or defined by different first and second respective arms that are each interconnected between the rack (e.g., the rear of the rack) and the FRU (e.g., the rear of the FRU). For instance, each of the first and second arms may be respectively movable relative to both the rack and the FRU as the FRU is being inserted into and withdrawn from the rack. In one arrangement, the first and second arms may include respective first portions that are pivotally attached to or relative to the FRU. For instance, the first portions of the first and second arms may be mounted for pivotal or rotational movement about respective first and second pivot axes or about a common (e.g., the same) pivot axis (e.g., where such axes or axis may be fixed or non-movable relative to the FRU). The first and second arms may also include respective second portions that are pivotally attached to or relative to first and second spaced locations on the rack. For instance, the second portions of the first and second arms may be mounted for pivotal or rotational movement about respective third and fourth pivot axes (e.g., where the third and fourth pivot axes may be parallel to each other and extend vertically or otherwise parallel to the vertical support posts of the rack). The third and fourth pivot axes (or common pivot axis) may in one embodiment be parallel to the first and second pivot axes.

Each of the first and second arms may also include a portion that is translatable (e.g., slidable) relative to the rack and/or the FRU as the FRU is being inserted into and withdrawn from the rack, where the degree or amount of translation or travel may be selected based on the desired limited amount of travel of the FRU away from the rear portion of the storage rack (e.g., an amount just necessary to allow for servicing of particular components of a FRU, such as a fan module of a server). As one example, each of the first and second arms may be in the form of first and second members that are slidably attached to each other in any appropriate manner. For instance, the first portion of the first arm may be disposed on the first member and the second portion of the first arm may be disposed on the second member. As the FRU is being inserted into or withdrawn from the rack, the first and second members of the first arm may slide relative to each other as the first portion of the first member pivots relative to the FRU and the second portion of the second member pivots relative to the rack. Simultaneously, the first member and FRU slide or translate relative to each other and the second member and rack slide or translate relative to each other. The second arm may be configured in a similar manner.

As another example, the second portions of each of the first and second arms may be both pivotally and slidably attached to or relative to the first and second spaced locations of the rack. For instance, any appropriate pivot member (e.g., pivot pin or the like) extending through the second portion of the first arm may be configured to ride in a slot or channel that is fixed to the first location of the rack. As the FRU is being inserted into or withdrawn from the rack, the first arm is configured to pivot about the pivot member as the pivot member simultaneously slides along the slot. The second arm may be configured in a similar manner. Additionally or alternatively, the first portions of each of the first and second arms may be both pivotally and slidably attached to or relative to the FRU.

In one arrangement, the disclosed cable management apparatus may include at least one other arm that is fixedly or rigidly attached to or adjacent the rear of the FRU (e.g., so as to be non-movable relative to the FRU) and to which at least one of the first and second arms may be movably (e.g., pivotally) attached. In one arrangement, the at least one other arm may be in the form of a third arm to which both of the first and second arms are pivotally attached (e.g., for pivotal movement about the same pivot axis or about respective third and fourth spaced pivot axes). In another arrangement, the at least one other arm may be in the form of third and fourth arms to which the first and second arms are respectively pivotally attached. In one embodiment, the at least one other arm may form an additional cable routing path between at least one of the first and second cable routing paths and the FRU. As one example, the additional cable routing path may extend substantially perpendicularly away from the rear of the FRU. Additionally or alternatively, the additional cable routing path may extend at other angles relative to the rear of the FRU (e.g., 45°, parallel to, etc.).

In one aspect disclosed herein, a system includes a computing rack having a framework with opposite front and rear portions, opposite first and second side portions, opposite top and bottom portions, and an interior storage area between the opposite front and rear portions, opposite first and second side portions, and opposite top and bottom portions. The disclosed system also includes at least a FRU mounted within the interior storage area for slidable movement towards and away from the rear portion of the framework along a central reference axis that is disposed substantially halfway between the first and second side portions, and a cable management apparatus interconnected between the FRU and the framework for controlling cables interfaced with the FRU as the FRU is slidably moved towards and away from the rear portion of the framework. The cable management apparatus includes a first arm having a first portion that is interconnected to the FRU and a second portion that is interconnected to the framework, where the first arm defines a first cable routing path that extends between the FRU and the framework on a first side of the central reference axis. The cable management apparatus also includes a second arm having a first portion that is interconnected to the FRU and a second portion that is interconnected to the framework, where the second arm defines a second cable routing path that extends between the FRU and the framework on a second side of the central reference axis.

In another aspect, a method of managing cables interfaced with a field replaceable unit (FRU) mounted for slidable movement along first axis in a bay of a storage rack is disclosed. The method includes positioning a first cable on a first cable management arm that is pivotally secured between a rear of the FRU and a first portion of the storage rack, and positioning a second cable on a second cable management arm that is pivotally secured between the rear of the FRU and a second portion of the storage rack that is opposite the first portion of the storage rack. The first and second cable management arms are substantially non-overlapping along a second axis that is perpendicular to the first axis.

In a further aspect, a FRU adapted for receipt in a receiving bay of a storage rack is disclosed that include a housing having opposite front and rear portions, opposite top and bottom portions, and opposite first and second side portions, where a central reference axis extends from the front portion to the rear portion at a location that is substantially halfway between the first and second side portions. The disclosed FRU also includes a cable management apparatus attached to the rear portion of the housing and including a base member extending away from the rear portion of the housing; a first arm pivotally attached to the base for swinging movement over a first area between the central reference axis and the first side portion; and a second arm pivotally attached to the base for swinging movement over a second area between the central reference axis and the second side portion.

Any of the embodiments, arrangements, or the like discussed herein may be used (either alone or in combination with other embodiments, arrangement, or the like) with any of the disclosed aspects. Merely introducing a feature in accordance with commonly accepted antecedent basis practice does not limit the corresponding feature to the singular. Any failure to use phrases such as "at least one" does not limit the corresponding feature to the singular. Use of the phrase "at least generally," "at least partially," "substantially" or the like in relation to a particular feature encompasses the corresponding characteristic and insubstantial variations thereof. Furthermore, a reference of a feature in conjunction with the phrase "in one embodiment" does not limit the use of the feature to a single embodiment.

In addition to the exemplary aspects and embodiments described above, further aspects and embodiments will become apparent by reference to the drawings and by study of the following descriptions.

DETAILED DESCRIPTION

Disclosed herein are cable management apparatuses, systems and methods (e.g., utilities) that limit the degree of travel of a FRU (e.g., server, other computing device, power supply, etc.) out of a storage rack to an amount just necessary to service one or more particular components of the FRU (e.g., fan bay, etc.) free of having to power down the FRU which provide a more cost effective maintenance strategy for users. Furthermore, the disclosed cable management utilities advantageously allow for the use of shorter cables between the FRU and other devices (e.g., other FRUs, switches, power supplies, etc.), improved airflow through the FRUs and the storage rack, reduced complexity of the cable management apparatus, simplified installation and manipulation of the apparatus, and the like.

One cable management apparatus disclosed herein includes first and second cable management arms that define opposite first and second cable routing paths for routing of cables from a rear portion of a FRU towards first and second opposite locations on the storage rack (e.g., such as first and second opposite side portions of a framework of the storage rack adjacent a rear of the storage rack). Each of the first and second arms may be movably (e.g., pivotally) attached to or relative the FRU (e.g., adjacent the rear of the FRU where cables are interfaced with the FRU). Furthermore, the first arm may be movably (e.g., pivotally) attached to or relative to a first location on the framework of the rack (e.g., near or adjacent a first side portion of the framework near a rear of the framework) and the second arm may be movably (e.g., pivotally) attached to or relative to an opposite, spaced second location on the framework of the rack (e.g., near or adjacent an opposite second side portion of the framework near the rear of the framework).

One or more cables interfaced between the FRU and other devices or components may be appropriately disposed over or secured to the first and second arms. As just one example, one or more power cables may be disposed over the first arm and thus directed via the first cable routing path towards the first side of the rack while one or more signals cables may be disposed over the second arm and thus directed via the second cable routing path towards the second side of the rack. In any case, when the FRU is in a substantially fully inserted position within the storage rack, the first and second arms (and thus the respective cables disposed over the first and second arms) may be substantially or fully non-overlapping along an axis or direction that extends between the first and second side portions of the rack and that is perpendicular to the axis along which the FRU is configured to slide within the rack.

More consistent and improved airflow through the rack (e.g., in a direction between the front and rear of the rack or otherwise parallel to the axis along which the FRU slides) can be achieved when the first and second arms are non-overlapping as the disclosed cable management apparatus presents fewer obstructions to such airflow as compared to, for instance, existing cable management devices including at least first and second arms or portions (along with the cables thereon) that fold against each other and overlap in the inserted or seated position of the FRU in the storage rack.

Furthermore, shorter cables can be used as the disclosed cable management apparatus limits the degree to which the FRU can be pulled out of the storage rack (e.g., an amount less than the amount that would expose the entire FRU outside of the rack), and as each particular arm (and thus a respective length of cable secured thereto or disposed thereover) need not be folded against itself in the substantially fully inserted position of the FRU in the storage rack. In this position, for instance, the first arm may extend towards and be substantially perpendicular to the first side portion of the rack (and parallel to the rear of the FRU) while the second arm may extend towards and be substantially perpendicular to the second side portion of the rack (and also parallel to the rear of the FRU).

When the FRU is at least partially pulled out of the rack or otherwise slid in a direction away from the rear portion of the rack and towards or past the front portion of the rack (e.g., such as to hot swap a fan module or the like within the FRU), the first and second arms move (e.g., pivot) relative to both the FRU and the rack to continue to support and control the cables as the FRU is being slid away from the rear portion of the rack. Furthermore, the first and second arms may remain in a non-overlapping orientation (e.g., relative to an axis extending between the first and second side portions and perpendicular to the axis of travel of the FRU) as the FRU is moved away from the rear portion of the rack. To allow the FRU to be slid away from the rear portion of the rack while the first and second arms continue to accommodate cables, the FRU, first and second arms, and the rack may form an extending mechanical linkage. For instance, each of the first and second arms may include first and second members that slide relative to each other as the FRU slides away from the rear portion and the first and second arms pivot relative FRU and the rack. The amount of relative sliding between the first and second members of each of the first and second arms may be limited in any appropriate manner to amount that allows for a desired limited amount of travel of the FRU out of the rack.

Figure 1:
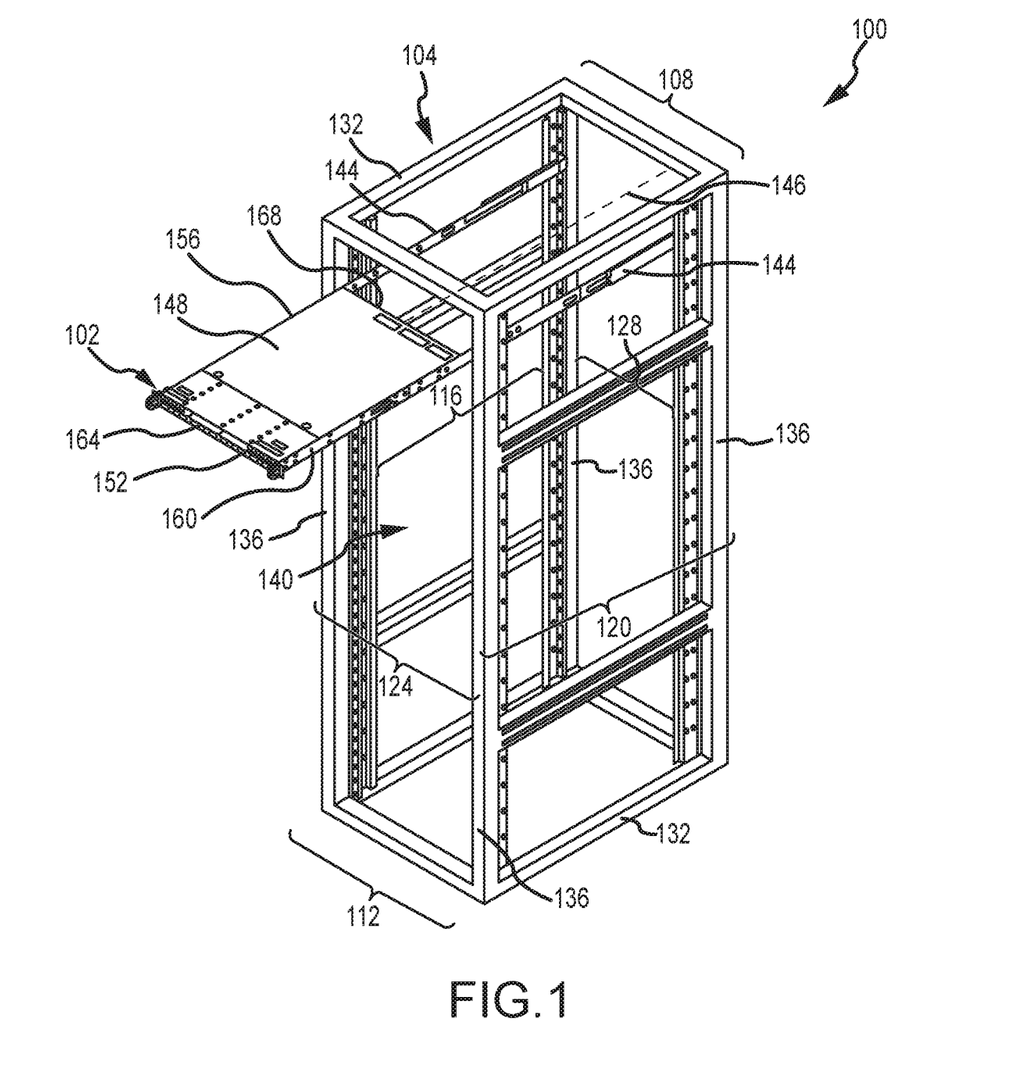
FIG. 1 is a perspective view of a storage rack for storing FRUs according to one embodiment.

FIG. 1 is a perspective view of one embodiment of a storage rack 100 (e.g., cabinet) operable to store one or more FRUs 102 (e.g., servers, hard disk drives, other computing or electronic devices, and/or the like) in a stacked or side by side manner. Broadly, the rack 100 may include a framework 104 generally including opposite top and bottom portions 108, 112, opposite first (e.g., left) and second (e.g., right) sides portions 116, 120, and opposite front and rear portions 124, 128. Each of the top and bottom portions 108, 112 may include a plurality of horizontal support members 132 while the first and second side portions 116, 120 and front and rear portions 124, 128 may include a plurality of vertical support members 136 extending upwardly from a floor or platform (not shown).

The various portions of the framework 104 generally collectively define a interior storage space 140 within the framework 104 for receiving a plurality of FRUs 102 therein, where the storage space 140 has a top portion (not labeled) generally coincident with the top portion 108 of the framework 104 and a bottom portion (not labeled) generally coincident with the bottom portion 112 of the framework 104. As shown, each vertical support member 136 may include a series of perforations or openings that may be used to define a plurality of bays arranged in a vertically stacked manner between the top and bottom portions 108, 112 of the framework 104 for receiving FRU. In one arrangement, each bay may include or be defined by a respective pair of rail assemblies 144 (only one pair being shown in FIG. 1) for slidably receiving a respective FRU 102 in the storage space 140.

For instance one of the rail assemblies may be appropriately secured to a first vertical support member 136 near the front portion 124 and a second vertical support member 136 near the rear portion 128 and form a portion of the first side portion 116 of the rack 100. The other of the rail assemblies may be appropriately secured to a third vertical support member 136 near the front portion 124 and a fourth vertical support member 136 near the rear portion 128 and form a portion of the second side portion 116 of the rack 100. The pair of rail assemblies 144 may allow the FRU 102 to slidably translate between an expanded position (e.g., as shown in FIG. 1) and a retracted/storage position within the storage space 140 along a reference axis that is parallel to a longitudinal axis of each of the rail assemblies and that extends from the front portion 124 to the rear portion 128. The FRU 102 may generally include opposite top and bottom portions 148, 152, opposite first and second side portions 156, 160, and opposite front and rear portions 164, 168.

Each bay may have a standardized height in multiples of one rack unit (U) to correspond with correspondingly sized FRUs 102. For instance, the framework 104 may have any appropriate height such as 18 U, 22 U, 36 U, 42 U, and the like, and any appropriate width such as 19 inches, 23 inches, and/or the like. The openings (not labeled) disposed between the various horizontal and vertical support members 132, 136 may be covered by any appropriate paneling and/or the like (e.g., panels, windows, access doors) including any number of openings, slots, and/or the like therethrough (e.g., for routing or cables and/or wires, ventilation to reduce operating temperatures of the computing devices, etc.). Although the rack 100 has been depicted as a box-like structure, this is not intended to be a limitation on the present disclosure. For instance, an open shelving style system could also be constructed, additional side panels could be installed so that multiple sub-boxes exist within a larger box, and/or the like. Furthermore, the various components of the rack 100 may be formed of metal, plastic, and/or the like.

As discussed previously, the FRU 102 often includes a number of cables (e.g., signal, power, etc.) interfaced to and extending from the rear portion 168 thereof that interconnect the FRU 102 with other FRUs, switches, power supplies, and the like. To allow for hot servicing of the FRU 102 (e.g., at least partially pull the FRU 102 out of the rack 100 to service the FRU 102 while keeping the cables electrically interfaced with the FRU 102), a cable management device or system (e.g., CMA) is typically provided that supports and/or guides the cables as the FRU 102 is being withdrawn to limit tangling of the cables and otherwise maintain order thereof. However, existing cable management systems are complex in design, require longer cables for implementation, impede airflow through the rack 100, and the like.

Figure 2:
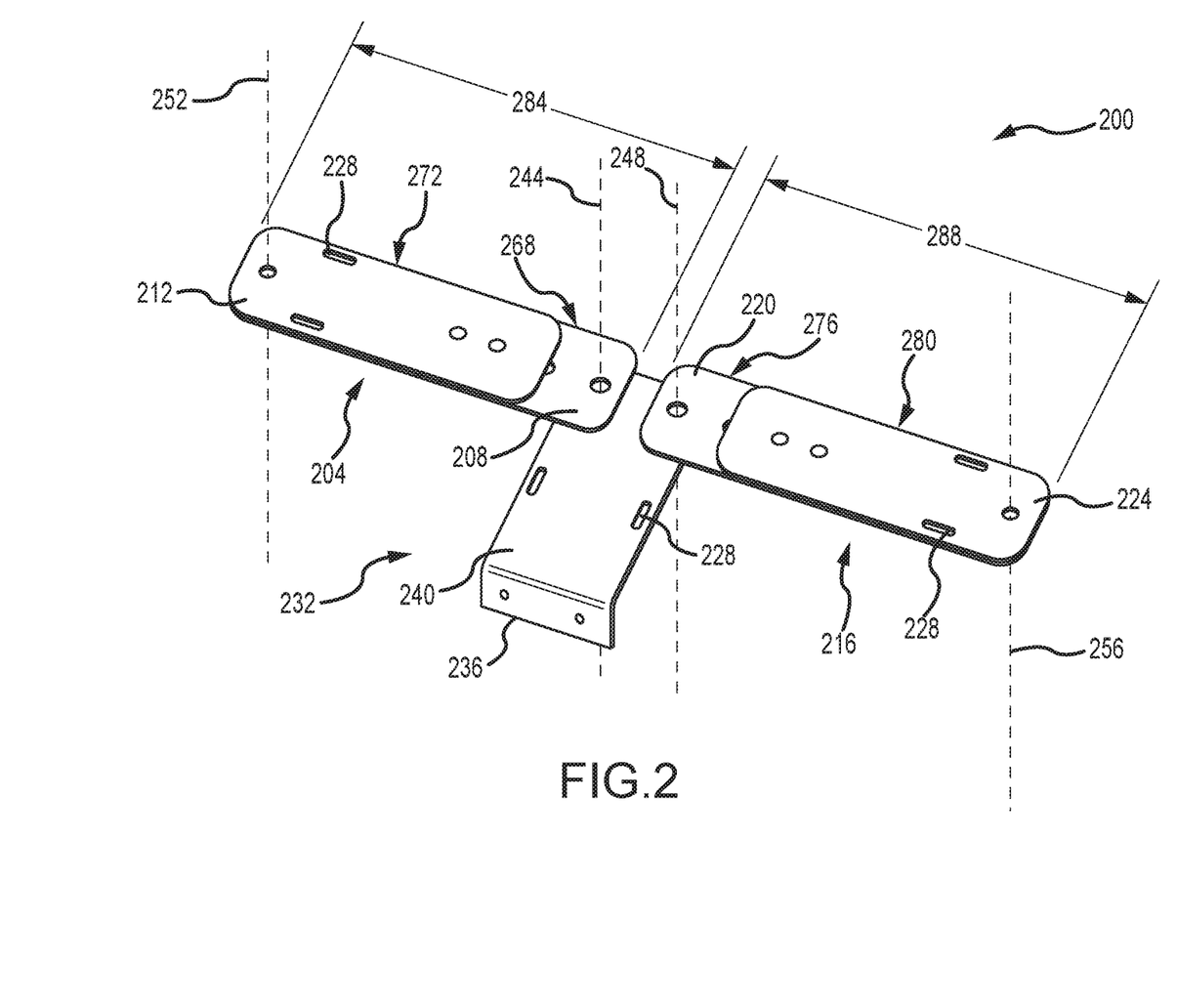
FIG. 2 is a perspective view of a cable management apparatus for use in the storage rack of FIG. 1, where the cable management apparatus is in a first orientation.

In this regard, FIG. 2 presents a perspective view of a cable management apparatus 200 according to one embodiment that is configured to be movably interconnected between the FRU 102 and the framework 104 of the rack 100 for controlling (e.g., managing, such as maintaining ordered positioning thereof) cables interfaced with the FRU 102 (e.g., with ports on or adjacent the rear portion 168 of the FRU 102) as the FRU 102 is slidably moved towards and away from the rear portion 128 of the framework 104 along axis 146 as well as limiting travel of the FRU 102 out of the front portion 124 of the rack 100 (e.g., an amount such that not all of the FRU 102 protrude past the front portion 124 of the rack 100. The cable management apparatus 100 advantageously allows for the use of shorter cables interfaced with the FRU 102, is less complex in design, results in less impedance of airflow through the framework 104, and the like. Additionally, FIG. 3 presents a perspective view of the cable management apparatus 200 interconnected to the FRU 102 and the framework 104 of the rack 100 for managing cables interfaced with the FRU 102 as discussed below.

The cable management apparatus 200 broadly includes a first arm 204 (e.g., one or more brackets, members, etc.) having a first portion 208 that is movably interconnected to or relative to the FRU 102 and a second portion 212 that is movably interconnected to or relative to the framework 104. The first arm 204 generally defines a first cable routing path that extends between the FRU and the framework on a first side of the central reference axis 146 (e.g., towards the first side portion 116 of the framework 104 adjacent the rear portion 128 of the framework 104) over which one or more cables interfaced with the FRU 102 may be secured or disposed. The cable management apparatus 200 also includes a second arm 216 (e.g., one or more brackets, members, etc.) having a first portion 220 that is movably interconnected to or relative to the FRU 102 and a second portion 224 that is movably interconnected to or relative to the framework 104. The second arm 216 generally defines a second cable routing path that extends between the FRU and the framework on a second side of the central reference axis 146 (e.g., towards the second side portion 120 of the framework 104 adjacent the rear portion 128 of the framework 104) over which one or more other cables interfaced with the FRU 102 may be secured or disposed.

As just one example, one or more cable ties, straps, and/or the like (not shown) may be wrapped around the first and second arms 204, 216 as well as one or more cables disposed thereover to restrict or limit movement of the cables away from the first and second arms 204, 216 (e.g., in a direction perpendicular to a top surface of the first and second arms 204, 216 over which the cables are disposed, and in first and second lateral directions away from first and second side edges of the first and second arms 204, 216) while still allowing for movement of the cables along the lengths of the first and second arms 204, 216 (e.g., in a direction parallel to or along the length of the top surface of the first and second arms 204, 216) as the FRU 102 is being pulled out of the framework 104 (being moved away from the rear portion 128) and inserted into the framework 104 (being moved towards the rear portion 128). For instance, each of the first and second arms 204, 216 may include one or more apertures 228 therein through which the one or more cable ties or the like may be inserted for use in holding the cables over the first and second arms 204, 216. Additionally or alternatively, various other arrangements or devices for holding cables relative to the first and second arms 204, 216 as discussed above are envisioned and included herein. As just one example, FIGS. 8-11 illustrate another embodiment of the cable management apparatus 200', where first and second side edges of each of the first and second arms 204, 216 include walls 290 extending therefrom for use in limiting or restricting movement of cables laid thereover in first and second opposite lateral directions.

Figure 3:
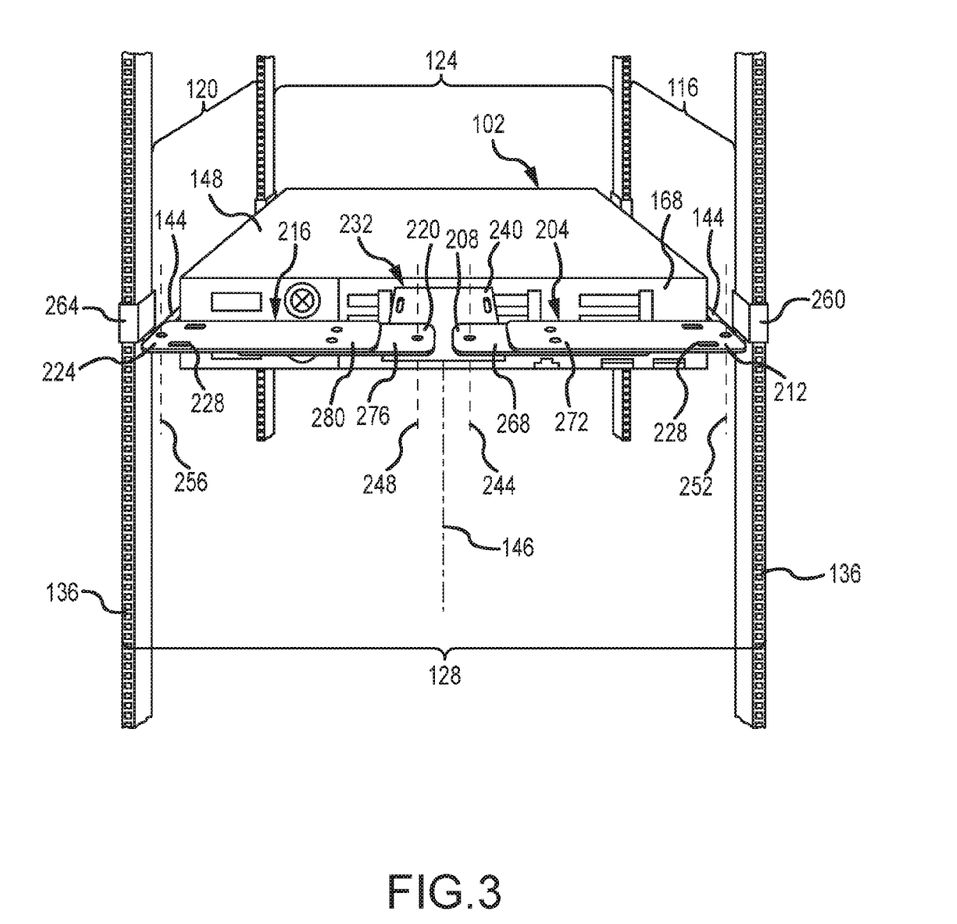
FIG. 3 is a perspective view of the cable management apparatus of FIG. 2 interconnected to a FRU and a storage rack with the FRU being in a substantially full inserted position within the storage rack.

With continued reference to FIGS. 2-3, the first portions 208, 220 of the first and second arms 204, 216 may be pivotally attached to or relative to the FRU 102. In one arrangement, the first portions 208, 220 may be directly pivotally attached to the FRU 102 about the same pivot axis or about different pivot axes in any appropriate manner. In another arrangement, and as shown in FIGS. 2-3, the first and second portions 208, 220 of the first and second arms 204, 216 may be pivotally attached to a third arm 232 (e.g., a base member in the form of one or more brackets, members, etc.) that is rigidly or non-movably attached to the FRU 102 and that defines a third cable routing path that intersects the first and second cable routing paths of the first and second arms 204, 216. For instance, the third arm 232 may include a mounting portion 236 that may be used to rigidly attach the third arm 232 to the FRU 102 in any appropriate manner and a cable routing portion 240 that defines the third cable routing path and to which the first portions 208, 220 of the first and second arms 204, 216 may be pivotally attached. As shown, the third arm 232 is also configured to space the first and second portions 208, 220 a distance away from the rear portion 168 of the FRU 102. This arrangement advantageously provides spaces for routing of cables that are interfaced with the FRU along the third routing path and then along the first or second routing paths to other devices, components, and the like.

In one embodiment, the first portions 208, 220 of the first and second arms 204, 216 may be pivotally attached to the cable routing portion 240 of the third arm 232 about first and second respective pivot axes 244, 248 in any appropriate manner (e.g., pins, bolts, etc.) to allow the first and second arms 204, 216 to pivot or swing relative to the FRU 102 as the FRU 102 is being moved along the axis 146. The first and second pivot axes 244, 248 may be parallel to each other and perpendicular to the central reference axis 146. In one arrangement, the first pivot axis 244 may be disposed on a first side of the central reference axis 146 so that the first arm 204 can swing over an area between the central reference axis 146 and the first side portion 116 of the framework 104 while the second pivot axis 248 may be disposed on an opposite second side of the central reference axis 146 so that the second arm 204 can swing over an area between the central reference axis 146 and the second side portion 120 of the framework 104. In other arrangements the first and second pivot axes 244, 248 may both be disposed on the first or second side of the central reference axis 146 (e.g., in which case one of the first and second arms 204, 216 may need to be longer than the other). In one embodiment, the first portions 208, 220 of the first and second arms 204, 216 may be pivotally attached to the cable routing portion 240 of the third arm 232 about a common (i.e., the same) pivot axis.

With continued reference to FIGS. 2-3, the second portions 212, 224 of the first and second arms 204, 216 may be pivotally attached to or relative to the framework 104 in any appropriate manner. In one arrangement, the second portion 212 of the first arm 204 may be pivotally attached to or relative to a first location or portion of the framework 104 about a third pivot axis 252 on a first side of the central reference axis 128 while the second portion 224 of the second arm 216 may be pivotally attached to or relative to a second location or portion of the framework 104 about a fourth pivot axis 256 on a second side of the central reference axis 128. As one example, the second portions 212, 224 may be pivotally attached to respective vertical support members 136 of the first and second side portions 116, 120 and the rear portion 128 of the framework 104. In an embodiment, the second portions 212, 224 may be pivotally attached to first and second respective brackets 260, 264 that are rigidly attached to the vertical support members 136. For instance, each of the first and second brackets 260, 264 may include one or more protrusions (e.g., pegs, etc.) that are configured to snap or otherwise be inserted into one or more apertures of the respective vertical support member 136. Furthermore, each of the mounting brackets 260, 264 may include a platform 266 (see FIG. 7, discussed below) that extends away from the vertical support member 136 towards the second portions 212, 224 of the first and second arms 204, 216 to provide a surface over or under which the second portions 212, 224 may be placed and pivotally secured for movement about the third and fourth pivot axes 252, 256.

As another example, the second portions 212, 224 may be pivotally attached to or relative to respective rail assemblies 144 of the first and second side portions 116, 120 of the framework 104 (e.g., the portions of the rail assemblies 144 that are fixed and non-movable relative to the framework 104 as the FRU 102 moves along the central reference axis 146). The third and fourth pivot axes 252, 256 may be parallel to the first and second pivot axes 244, 248 and perpendicular to the central reference axis 146.

In any case, FIG. 3 illustrates the FRU 102 being in a substantially fully inserted position along the central reference axis 146 within the storage rack 100. In this position, the first and second arms 204, 216 (and thus the respective cables disposed over the first and second arms) may be substantially or fully non-overlapping along an axis or direction that extends from the first side portion 116 to the second side portion 120 and that is perpendicular to the central reference axis 146 along which the FRU 102 is configured to slide within the storage rack 100. This arrangement advantageously allows for more consistent and improved airflow through the storage rack 100 (e.g., in a direction between the front and rear of the rack or otherwise parallel to the central reference axis 146) as it presents fewer obstructions to such airflow as compared to, for instance, existing cable management devices including at least first and second arms or portions (along with the cables thereon) that fold against each other and overlap along the axis or direction that extends from the first side portion 116 to the second side portion 120 and that is perpendicular to the central reference axis 146. Furthermore, shorter cables can be used as each of the first and second arms 204, 216 (and thus a respective length of cable secured thereto or disposed thereover) need not be folded against itself in the substantially fully inserted position of the FRU in the storage rack (again, as compared to existing arrangements). For instance, the first arm 204 may extend towards and be substantially perpendicular to the first side portion 116 of the framework 104 (and parallel to the rear portion 168 of the FRU 102) while the second arm 212 may extend towards and be substantially perpendicular to the second side portion 120 of the rack (and also parallel to the rear portion 168 of the FRU 102).

Figure 4:
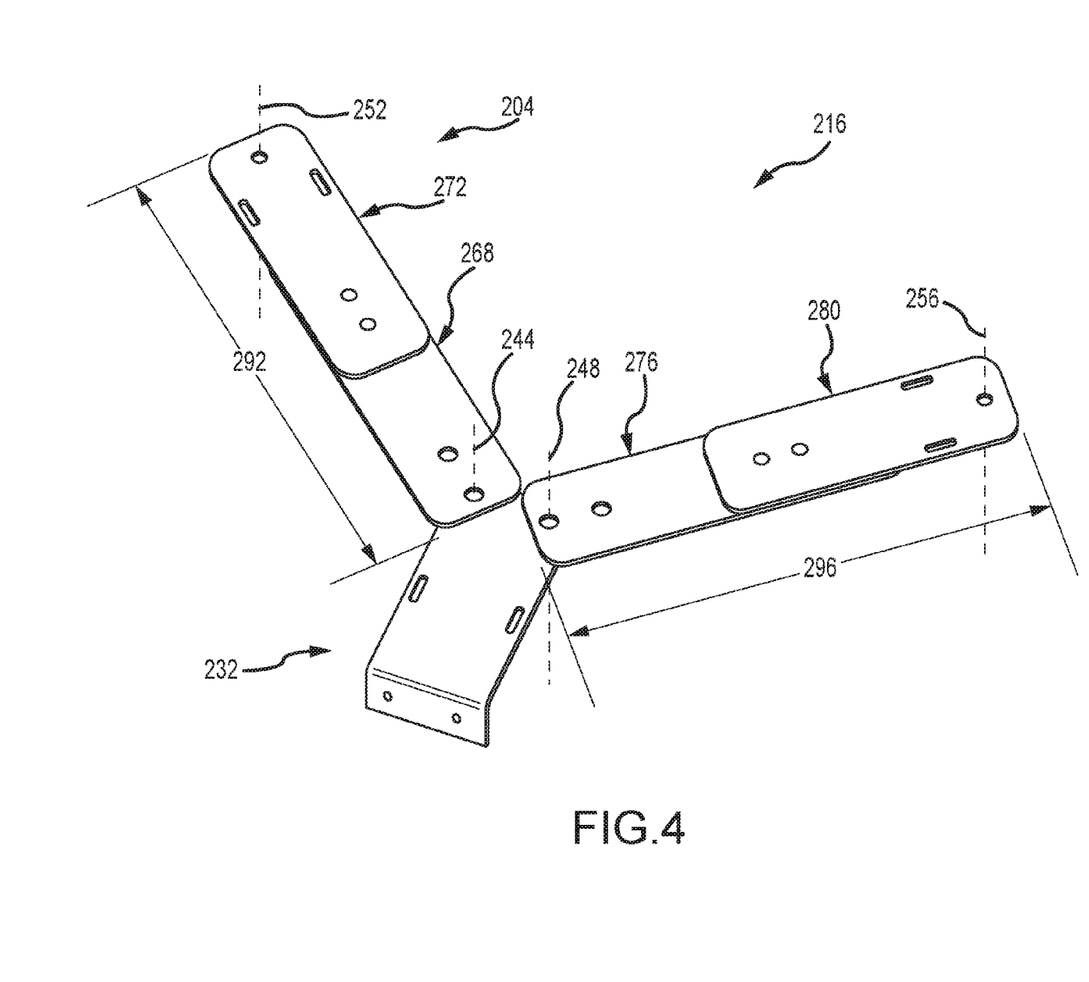
FIG. 4 is a perspective view of the cable management apparatus of FIG. 2 but in a second orientation.
Figure 5:
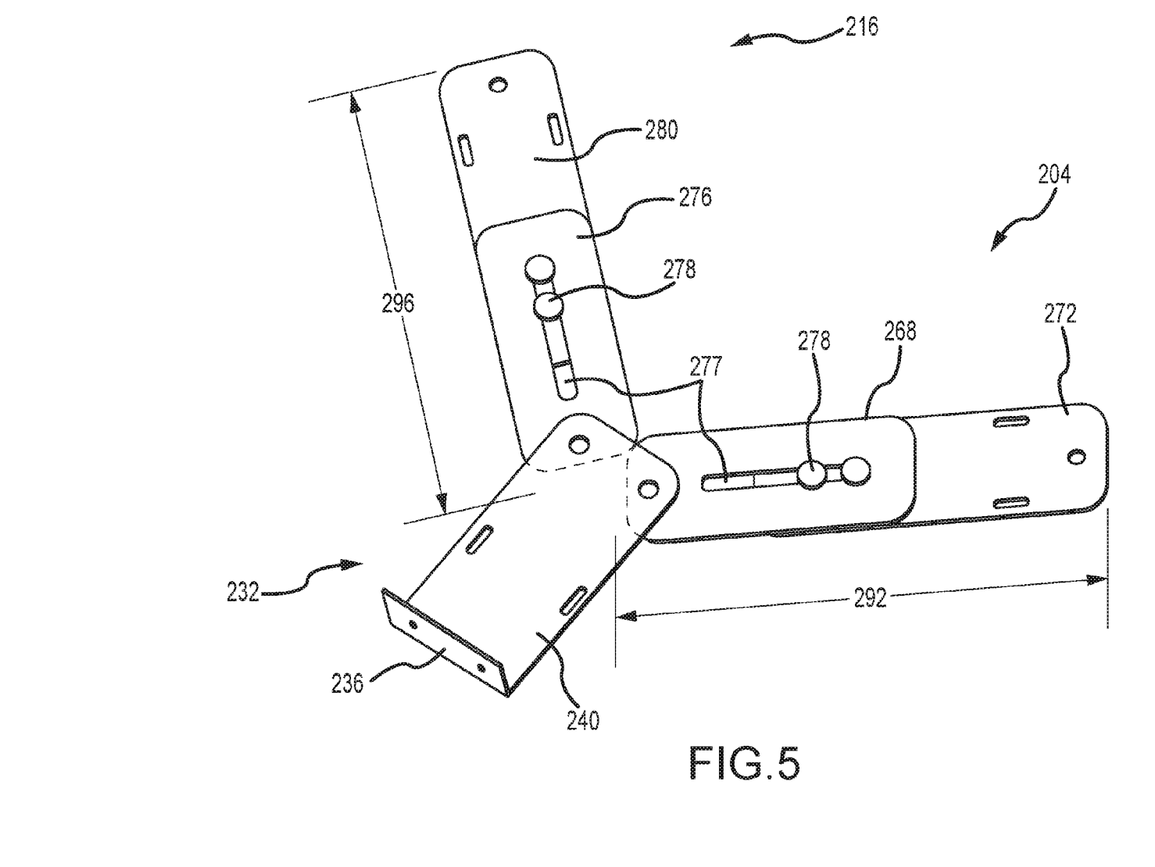
FIG. 5 is a perspective view of the cable management apparatus of FIG. 4 in the second orientation but from a bottom perspective.

When the FRU 102 is at least partially pulled out of the storage rack 100 or otherwise slid in a direction away from the rear portion 128 of the framework 104 along the central reference axis 146 (e.g., such as to hot swap a fan module or the like within the FRU 102), each of the first and second arms 204, 216 moves (e.g., pivots, swings) relative to both the FRU 102 and the framework 104 of the storage rack 100 to continue to support and control the cables as the FRU 102 is being slid away from the rear portion 128 of the framework 104. See FIGS. 4-6. Furthermore, the first and second arms 204, 216 may remain in a non-overlapping orientation (e.g., relative to the axis extending from the first side portion to the second side portion and perpendicular to the central reference axis 146) as the FRU 102 is moved away from the rear portion 128 of the framework 104 to continue to allow for the above-noted improved airflow through the storage rack 100.

To allow the FRU 102 to be slid away from the rear portion 128 of the framework 104 along the central reference axis 146 while the first and second arms 204, 216 pivot relative to the FRU 102 and the framework 104 to accommodate cables as discussed above, each of the first and second arms 204, 216 may include a portion that is translatable (e.g., slidable, displaceable) relative to the framework 104 and/or the FRU 102 as the FRU 102 is being inserted into and withdrawn from the storage rack 100 along the central reference axis 146. Furthermore, the amount of translation or displacement of the portion of each of the first and second arms 204, 216 may be appropriately limited to induce a corresponding limit on the travel of the FRU 102 away from the rear portion 128 (e.g., such as that only necessary to access or service particular component of the FRU 102). As one example, the first arm 204 may be in the form of first and second members 268, 272 that are slidably attached to or relative to each other in any appropriate manner, where the first portion 208 is disposed on the first member 268 and the second portion 212 is disposed on the second member 272. Similarly, the second arm 216 may be in the form of first and second members 276, 280 that are slidably attached to or relative to each other in any appropriate manner, where the first portion 220 is disposed on the first member 276 and the second portion 224 is disposed on the second member 280. As just one example, the first members 268, 276 may include at least one slot 277 while the second members 272, 280 may include at least one pin or protrusion 278 that is slidable in the slot to allow the first members 268, 276 to slide relative to the second members 272, 280. See FIG. 5. For instance, the length of the slots 277 may be selected based on the desired amount of travel of the FRU 102 away from the rear portion 128 and toward or just past the front portion 124. Various other manners of allowing for slidability between the first and second members 268, 272 of the first arm 204 and the first and second members 276, 280 of the second arm 216 are envisioned and encompassed herein.

With reference to FIGS. 2-3, it can be seen how the first and second arms 204, 216 have respective first lengths 284, 288 when the FRU 102 is in the substantially fully inserted position along the central reference axis 146 within the storage rack 100. To allow the FRU 102 to slide along the central reference axis 146 away from the rear portion 128 of the framework 104 (i.e., to allow the FRU 102 to be at least partially withdrawn) while the first portions 208, 220 pivot relative to the FRU 102 and the second portions 212, 224 pivot relative to the framework 104, the first and second members 268, 272 of the first arm 204 may slide relative to each other to expand or lengthen the first arm 204 such that it has a second length 292 longer than the first length 284 and the first and second members 276, 280 of the second arm 216 may slide relative to each other to expand or elongate the second arm 216 such that it has a second length 296 longer than the first length 288. See FIGS. 4-6. This arrangement also allows the first and second arms 204, 216 to automatically accommodate increasing portions of the cables disposed thereover as the FRU 102 is withdrawn. Furthermore, the difference between the first lengths 284, 288 and the second lengths 292, 296 may be chosen based on a desired amount of travel of the FRU 102 away from the rear portion 128 of the rack 100. When the FRU 102 is pushed back into the rack into its substantially fully inserted position as in FIG. 3, the first and second members 268, 272 of the first arm 204 slide relative to each other to shorten the first arm 204 back into its first length 284 and the first and second members 276, 280 of the second arm 216 slide relative to each other to shorten the second arm 216 back into its first length 288.

In addition or as an alternative to each of the first and second arms 204, 216 including first and second slidable members, the second portions 212, 224 of each of the first and second arms may be both pivotally and slidably attached to or relative to the first and second spaced locations of the storage rack 100. As one example, any appropriate pivot member (e.g., pivot pin or the like, not shown) extending through the second portion 212 of the first arm 204 may be configured to ride in a slot or channel that is fixed to the first side portion 116 of the framework 104 (e.g., a curved slot or channel of the first bracket 260, not shown). As the FRU 102 is being inserted into or withdrawn from the storage rack 100, the first arm 204 may pivot about the pivot member as the pivot member simultaneously slides along the slot (e.g., such that the third pivot axis 252 is slidable relative to the storage rack 100). The second arm 216 may be configured in a similar manner (e.g., such that the fourth pivot axis 256 is slidable relative to the storage rack 100). Additionally or alternatively, the first portions 208, 220 of the first and second arms 204, 216 may be both pivotally and slidably attached to or relative to the FRU 102 (e.g., such that the first and second pivot axes 244, 248 are slideable relative to the FRU 102).

Figure 6:
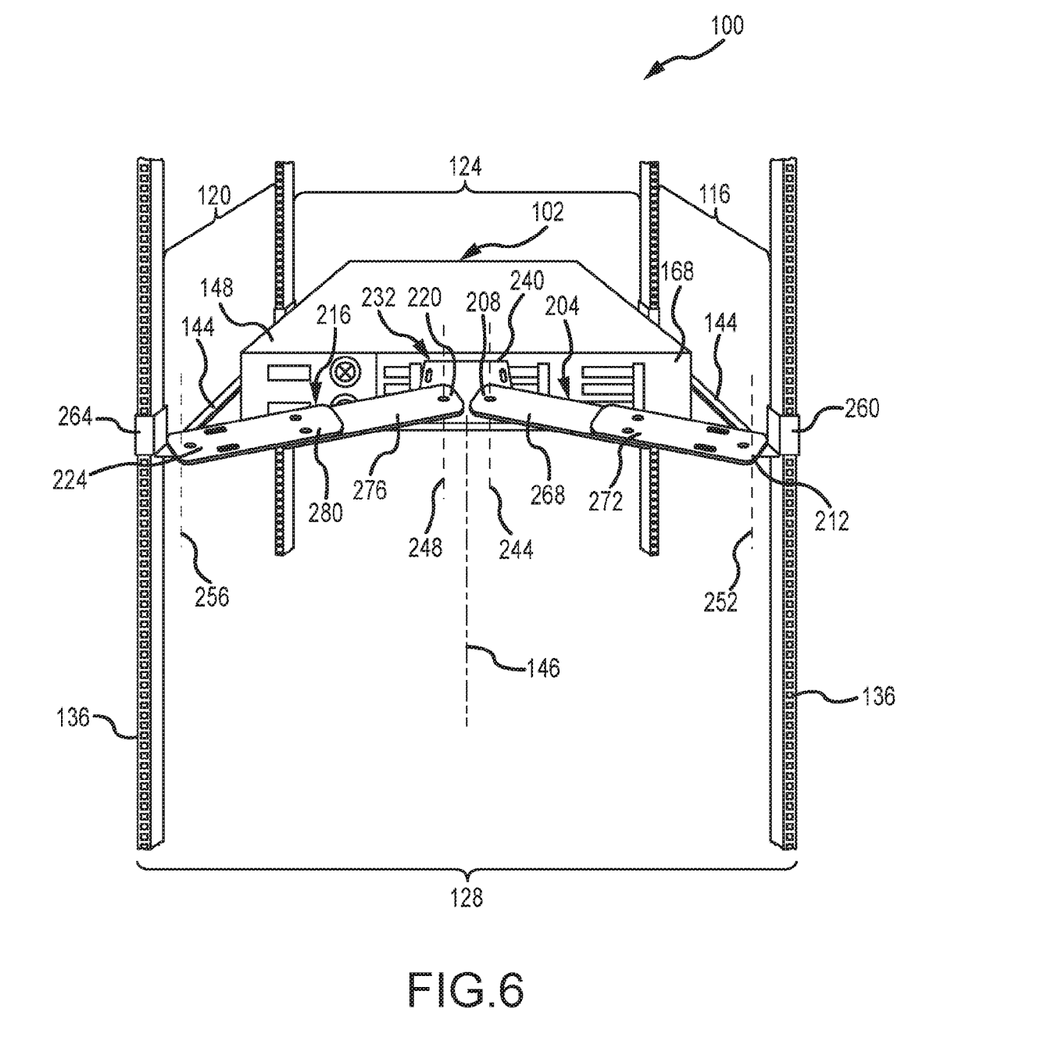
FIG. 6 is similar to FIG. 3 but with the cable management apparatus being in the second orientation as in FIG. 4 and the FRU being in a partially withdrawn and pull limited position in the storage rack.
Figure 7:
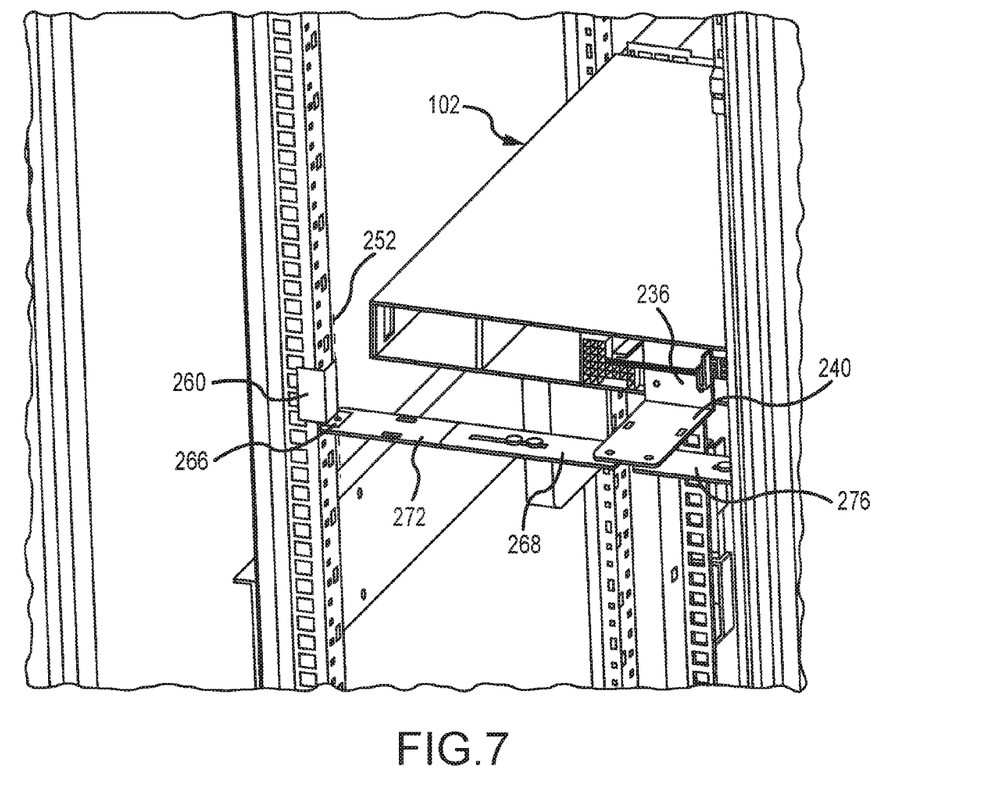
FIG. 7 is a perspective view of the cable management apparatus of FIG. 2 being interconnected to a FRU and a storage rack but with the cable management apparatus being upside down relative to the position in FIG. 2.
Figure 8:
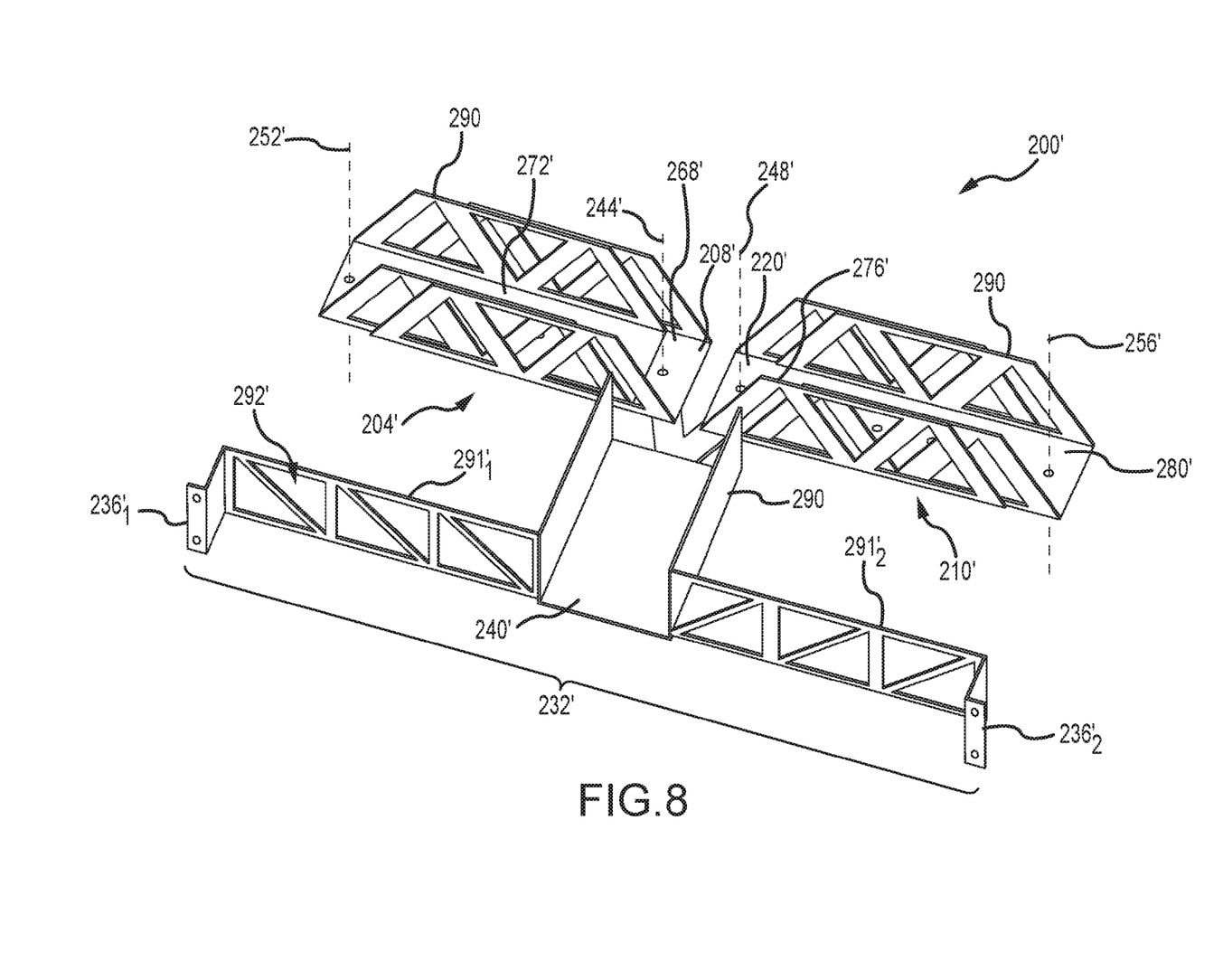
FIG. 8 is a perspective view of a cable management apparatus according to another embodiment for use in the storage rack of FIG. 1, where the cable management apparatus is in a first orientation.
Figure 9:
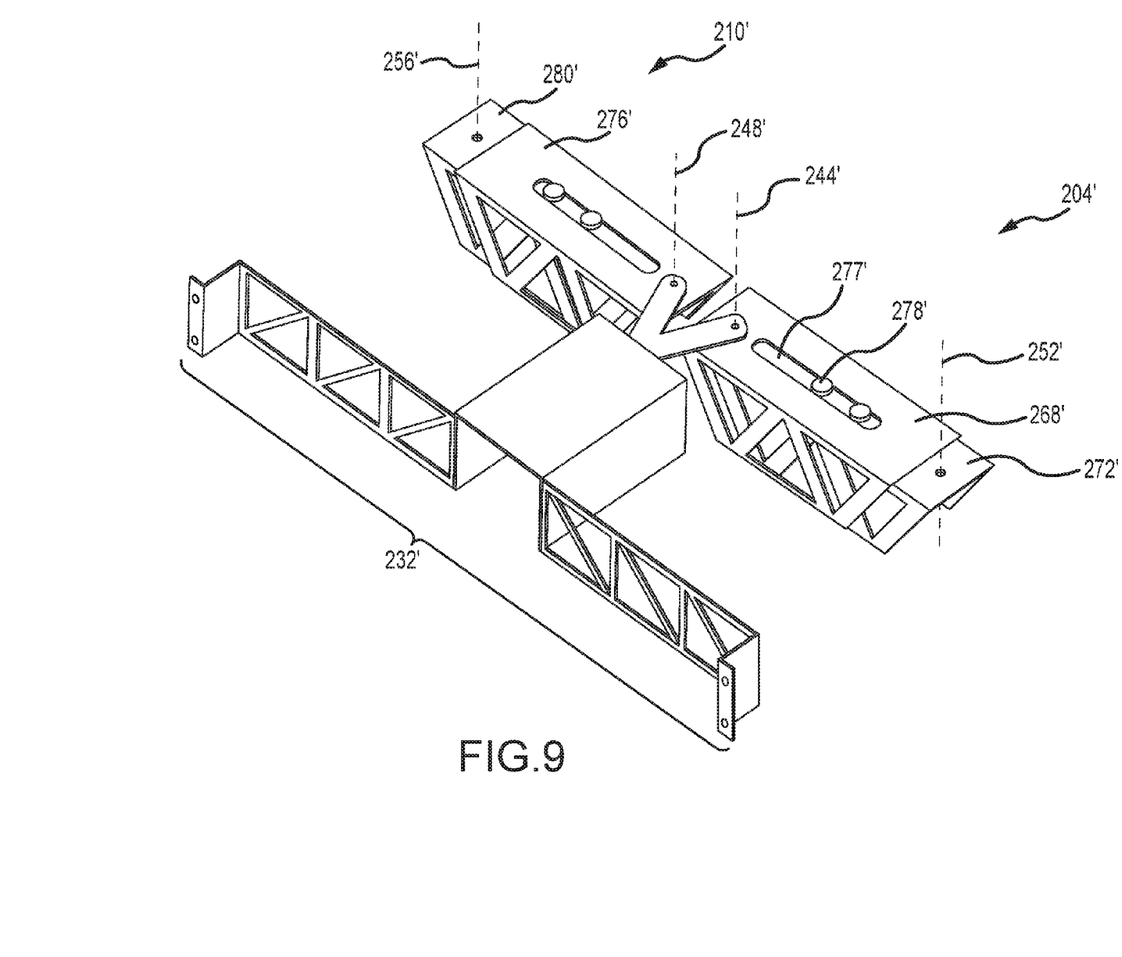
FIG. 9 is a perspective view of the cable management apparatus of FIG. 8 in the first orientation but from a bottom perspective.
Figure 10:
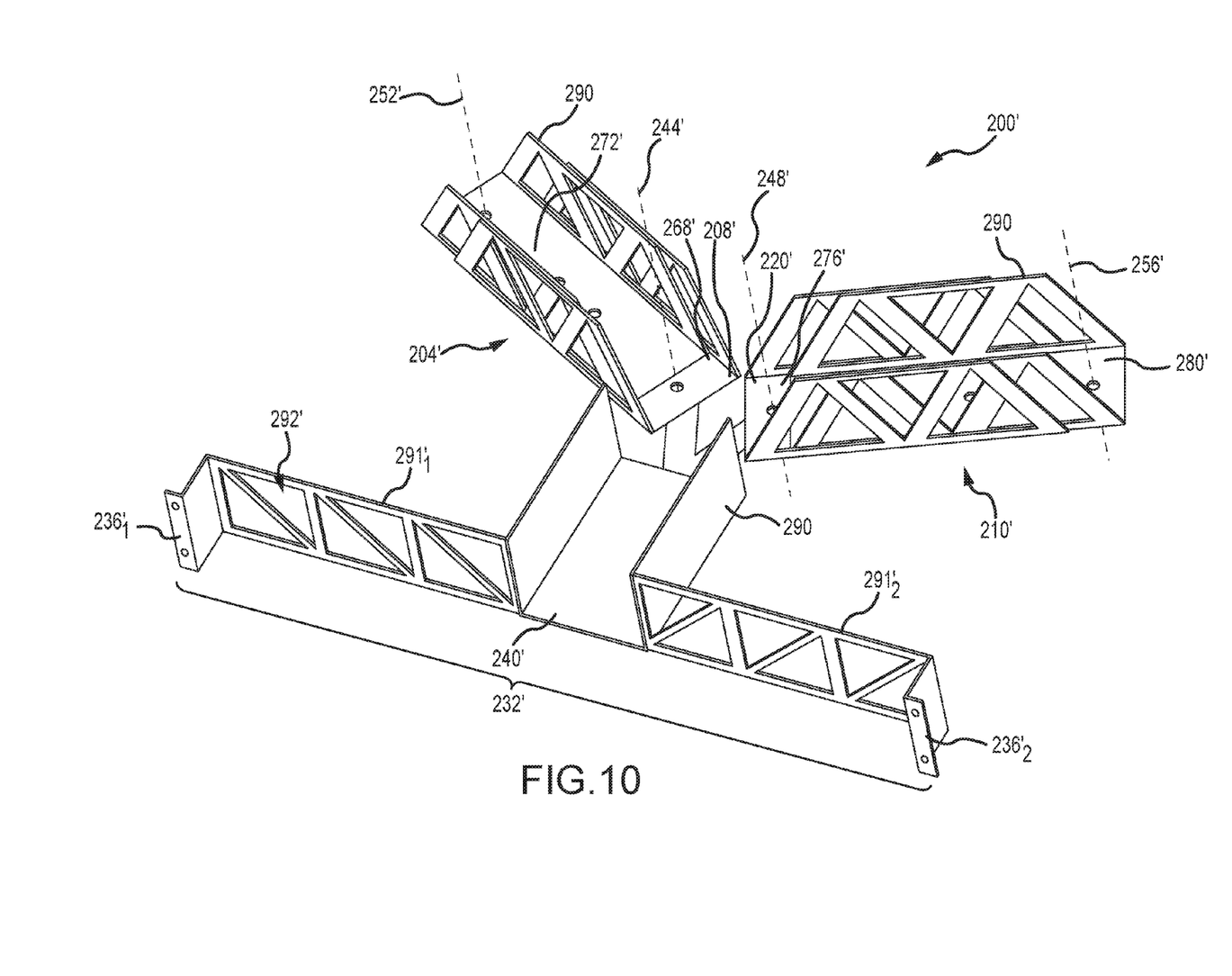
FIG. 10 is a perspective view of the cable management apparatus of FIG. 8 but in a second orientation.
Figure 11:
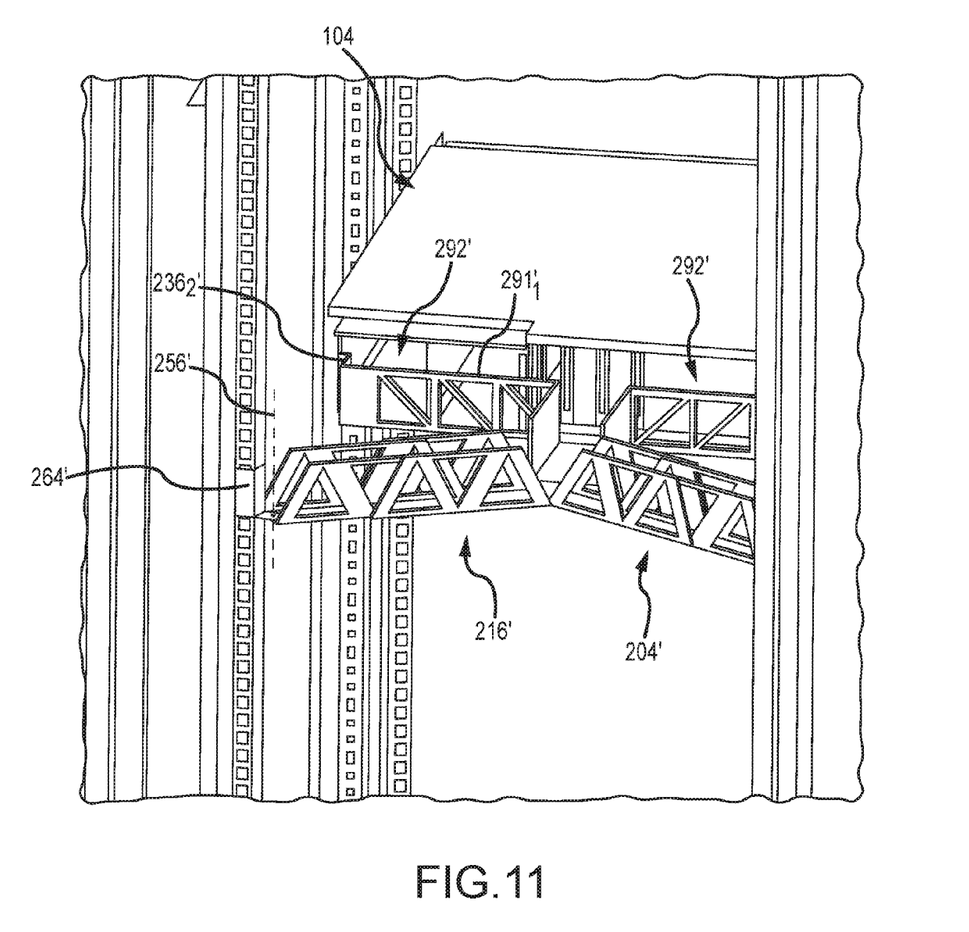
FIG. 11 is a perspective view of the cable management apparatus of FIG. 10 interconnected to a FRU and a storage rack with the FRU being in a partially withdrawn position in the storage rack.

FIG. 7 illustrates another arrangement whereby the cable management apparatus 100 may be mounted to the storage rack 100 and FRU 102 in an upside down configuration relative to that in FIGS. 3 and 6. FIGS. 8-11 illustrate another embodiment of the cable management apparatus and is thus depicted with reference numeral 200'. As discussed previously, the first and second arms 204', 216' may include one or more walls 290 extending away from lateral edges thereof for use in further defining the first and second cable routing paths and further containing cables, wires, etc. laid thereof. As also shown, the cable routing portion 240' of the third arm 232' may also include one or more walls 290 extending therefrom for use in further defining the third cable routing path. In one arrangement, the third arm 232' may include first and second extension members $291_1'$, $291_2'$ extending in opposite directions away from the cable routing portion 240' to which first and second mounting portions $236_1'$, $236_2'$ are respectively attached. With reference to FIGS. 8 and 11, it can be seen how the first and second extension members $291_1'$, $291_2'$ and first and second mounting portions $236_1'$, $236_2'$ may be configured to define a fourth cable routing path 292' (e.g., cage) that intersects and extends generally perpendicularly to the third cable routing path defined by the cable routing portion 240' of the third arm 232'. For instance, the first and second extension members $291_1'$, $291_2'$ and the rear portion 168 of the FRU 102 may generally define first and second opposite walls of the fourth cable routing path 292' while the first and second mounting portions $236_1'$, $236_2'$ may generally define third and fourth opposite walls of the fourth cable routing path 292' in between the first and second opposite walls of the fourth cable routing path 292'.

It will be readily appreciated that many additions to and/or deviations from the specific embodiments disclosed in the specification may be made without departing from the spirit and scope of the invention. It is also to be understood that the various numerical labels given to particular components or features herein (e.g., "first," "second," etc.) have merely been provided for the purposes of facilitating the reader's understanding of the present disclosure and do not necessarily limit features herein labeled as "first" from being a "second," or vice versa, and/or the like.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment or arrangement can also be implemented in multiple embodiments or arrangements separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The above described embodiments including the preferred embodiment and the best mode of the invention known to the inventor at the time of filing are given by illustrative examples only.

We claim:

1. A system, comprising:
   a computing rack comprising a framework having opposite front and rear portions, opposite first and second side portions, opposite top and bottom portions, and an interior storage area between the opposite front and rear portions, opposite first and second side portions, and opposite top and bottom portions;
   at least a first field replaceable unit (FRU) mounted within the interior storage area for slidable movement towards and away from the rear portion of the framework along a central reference axis that is disposed substantially halfway between the first and second side portions; and
   a cable management apparatus interconnected between the FRU and the framework for controlling cables interfaced with the FRU as the FRU is slidably moved towards and away from the rear portion of the framework, wherein the cable management apparatus includes:
      a first arm having a first portion that is interconnected to the FRU and a second portion that is interconnected to the framework, wherein the first arm defines a first cable routing path that extends between the FRU and the framework on a first side of the central reference axis; and
      a second arm having a first portion that is interconnected to the FRU and a second portion that is interconnected to the framework, wherein the second arm defines a second cable routing path that extends between the FRU and the framework on a second side of the central reference axis, wherein the first arm is movable relative to the FRU and the framework, wherein the second arm is movable relative to the FRU and the framework, wherein the first portion of the first arm is pivotally interconnected to the FRU, wherein the first portion of the second arm is pivotally interconnected to the FRU, wherein the second portion of the first arm is pivotally interconnected to the rack, wherein the second portion of the second arm is pivotally interconnected to the rack, wherein the first arm includes a first member on which the first portion of the first arm is disposed, wherein the first arm includes a second member on which the second portion of the first arm is disposed, and wherein the first and second members are slidable relative to each other.

2. The system of claim 1, wherein the second portion of the first arm is movably connected to the first side portion of the framework, and wherein the second portion of the second arm is movably connected to the second side portion of the framework.

3. The system of claim 1, wherein the first portion of the first arm is pivotally interconnected to the FRU for rotation about a first pivot axis, wherein the first portion of the second arm is pivotally interconnected to the FRU for rotation about a second pivot axis, and wherein the first and second pivot axes are different.

4. The system of claim 3, wherein the first and second pivot axes are non-movable relative to the FRU.

5. The system of claim 1, wherein the first portion of the first arm and the first portion of the second arm are pivotally interconnected to the FRU for rotation about a common pivot axis.

6. The system of claim 1, wherein the first portion of the first arm is rotatable about a pivot axis that is movable relative to the FRU, and wherein the first portion of the second arm is rotatable about a pivot axis that is movable relative to the FRU.

7. The system of claim 6, wherein the second portion of the first arm is rotatable about a pivot axis that is movable relative to the rack, and wherein the second portion of the second arm is rotatable about a pivot axis that is movable relative to the rack.

8. The system of claim 1, wherein the second portion of the first arm is rotatable about a pivot axis that is movable relative to the rack, and wherein the second portion of the second arm is rotatable about a pivot axis that is movable relative to the rack.

9. The system of claim 1, wherein the cable management apparatus further includes a third arm attached to the FRU, wherein the third arm defines a third cable routing path that intersects at least one of the first and second cable routing paths.

10. The system of claim 9, wherein the third cable routing path intersects both of the first and second cable routing paths.

11. The system of claim 1, wherein the first and second cable routing paths are substantially non-overlapping along an axis that extends perpendicularly between the first and second side portions of the framework.

12. The system of claim 1, wherein the first and second portions of the first arm are not foldable against each other.

13. The system of claim 12, wherein the first and second portions of the second arm are not foldable against each other.

14. A method of managing cables interfaced with a field replaceable unit (FRU) mounted for slidable movement along first axis in a bay of a storage rack, the method comprising:
   positioning a first cable on a first cable management arm that is pivotally secured between a rear of the FRU and a first portion of the storage rack;
   positioning a second cable on a second cable management arm that is pivotally secured between the rear of the FRU and a second portion of the storage rack that is opposite the first portion of the storage rack, wherein the first and second cable management arms are substantially non-overlapping along a second axis that is perpendicular to the first axis; and
   moving the FRU along the first axis, wherein the first and second cable management arms remain substantially non-overlapping along the second axis during the moving, wherein each of the first and second cable management arms includes a first length with the FRU in a first position along the first axis, and wherein the method includes:
      moving the FRU to a second position along the first axis, wherein each of the first and second cable management arms includes a second length with the FRU in the second position along the first axis, and wherein the second length is different than the first length.

15. The method of claim 12, wherein the first cable management arm is not foldable against itself.

16. The method of claim 15, wherein the second cable management arm is not foldable against itself.

17. A field replaceable unit (FRU) adapted for receipt in a receiving bay of a storage rack, the FRU comprising:
   a housing having opposite front and rear portions, opposite top and bottom portions, and opposite first and second side portions, wherein a central reference axis extends from the front portion to the rear portion at a location that is substantially halfway between the first and second side portions; and
   a cable management apparatus attached to the rear portion of the housing, wherein the cable management apparatus includes:
      a base member extending away from the rear portion of the housing;
      a first arm pivotally attached to the base member for swinging movement over a first area between the central reference axis and the first side portion; and
      a second arm pivotally attached to the base member for swinging movement over a second area between the central reference axis and the second side portion.

* * * * *

UNITED STATES PATENT AND TRADEMARK OFFICE
CERTIFICATE OF CORRECTION

PATENT NO. : 9,769,947 B1
APPLICATION NO. : 15/075312
DATED : September 19, 2017
INVENTOR(S) : Sands et al.

Page 1 of 1

It is certified that error appears in the above-identified patent and that said Letters Patent is hereby corrected as shown below:

In the Claims

Column 16, Line 28, Claim 15, delete "claim 12," and insert -- claim 14, --, therefor.

Signed and Sealed this
Twelfth Day of June, 2018

Andrei Iancu
*Director of the United States Patent and Trademark Office*